United States Patent [19]
Van Eggermond et al.

[11] Patent Number: 4,903,704
[45] Date of Patent: Feb. 27, 1990

[54] METHOD AND APPARATUS FOR MR IMAGING

[75] Inventors: Johannes M. Van Eggermond, Bridgeport; Russell Whitman, II, Ansonia; Abraham Naparstek, Orange; Stamatis M. Rombotis, Huntington, all of Conn.

[73] Assignee: North American Philips Corporation, New York, N.Y.

[21] Appl. No.: 896,547

[22] Filed: Aug. 14, 1986

[51] Int. Cl.$^4$ .............................................. A61B 5/05
[52] U.S. Cl. .................................. 128/653 A; 128/696
[58] Field of Search ............... 128/653, 696, 702, 703, 128/706, 708, 659, 804; 324/309

[56] References Cited

U.S. PATENT DOCUMENTS

| 4,245,647 | 1/1981 | Randall | 128/659 |
| 4,602,641 | 7/1986 | Feinberg | 128/653 |
| 4,649,930 | 3/1987 | Groch et al. | 128/653 |

FOREIGN PATENT DOCUMENTS 0132785  2/1985  European Pat. Off. ............ 128/653

OTHER PUBLICATIONS

McRobbie et al, "Cardiac Response to Pulsed Magnetic Fields with Regard to Safety in NMR Imaging", Phy. Med. Biol 1985 vol. 30, No. 7 pp. 695-702.
Runge et al, "Respiratory Gating in Magnetic Resonance Imaging, at 0.5 Tesla", Radiology 1984 vol. 151 pp. 521-523.

Primary Examiner—Ruth S. Smith
Attorney, Agent, or Firm—Jack E. Haken

[57] ABSTRACT

An MR imaging method and apparatus especially adapted for invivo cardiac MR imaging, rejects data acquired during periods of arrhythmia while maintaining the magnetic fields and pulsing of the RF coils during such periods. Data acquisition is resumed after M cycles of regular period, and after remeasuring the data acquired during N cycles prior to the occurrence of the arrhythmia, where M and N are integers preferably from 1 to 5. The average timing can periodically be recalculated in order to compensate for slow changes in cardiac rate.

14 Claims, 2 Drawing Sheets

METHOD AND APPARATUS FOR MR IMAGING

This invention relates to nuclear magnetic resonance imaging (MR imaging), and is more in particular directed to an improved method and apparatus for eliminating the effects of deviation in cyclical variations of physical characteristics of biological tissue in the in vivo measurement of chemical characteristics of biological tissue. The invention is hence especially adapted to the elimination of the influence of arrhythmia in cardiac MR imaging.

MR spectroscopy, the process of analyzing a small sample in a uniform magnetic field and obtaining radio frequency data resulting from precisely pulsed radio frequency excitation, was invented by Block and Purcell. In the past 16 years, MR analysis by spectroscopy has shifted from physical chemistry to biological chemistry and biological medical applications; i.e., biopsy samples of normal and diseased tissues. Lauterbur and Damadian and others separately invented the utilization of MR principles to produce an image. (R. Damadian, Science 171,1151, 1971; P. C. Lauterbur, Nature 242, 190, 1973 and P. C. Lauterbur, Pure and Applied Chemistry, 40, 149, 1974). The resulting devices, MR imaging systems produced two dimensional and three dimensional data where gray scale represented is a function of a number of parameters, including for example the three parameters nuclide density, $T_1$ (longitudinal relaxation time) and $T_2$ (transverse relaxation time) especially in an anatomical image.

MR imaging techniques are disclosed, for example, in "Proton NMR Tomography" P. R. Locher, Philips Technical Review, vol. 41, 1983/84, no. 3, pages 73–88, the contents of which are incorporated herein by reference as a background of MR imaging technology.

Briefly, when a substance that contains protons is located in a homogeneous magnetic field and is in thermal equilibrium, it has a nuclear magnetization in the direction of the field, since there are more spins aligned with the field than spins aligned otherwise. The excess of spins aligned with the field is very small. If, at a certain moment, the magnetization is rotated momentarily through an angle with respect to the former axis thereof, the magnetization will describe a precession around this axis. If the spectrum of the precession is determined there should be a sharp resonance line at the Larmor frequency. The Larmor precession will decay with the relaxation times $T_1$ and $T_2$. The momentary rotation of the magnetization may be effected by the application of an R.F. pulse to the sample, by means of an excitation pulse, the pulse having a frequency approximately equal to the central Larmor frequency of the spin system. The Larmor precession results in the production of an R.F. voltage that may be recovered and detected, the frequency being a function of the magnetic field and the chemical composition of the material. By providing a field gradient, it is possible to obtain an indication of the location of material of determined chemical composition in the magnetic field, and by employing Fourier transformation it is possible to reconstruct images showing the distribution of one or more chemical constituents in the sample.

In vivo MR imaging of biological tissue is rendered more difficult by movement of the biological tissue. This is especially true for example, in cardiac MR imaging, as a result of the heartbeat. In order to prevent blurring and movement artifacts in cardiac MR imaging, it is known to synchronize the measurements to the patients E.C.G., for example, as disclosed in U.S. Pat. No. 4,409,550. Fossel et al. and U.S. Pat. No. 4,413,233, Fossel et al. Typically, in the known arrangements, each data collection is started at some fixed time delay after the R-peak. In a multiple slice study, data collection continues close to the next R-peak. If the heart beats regularly, each measurement will take place at the same phase in the cardiac cycle.

In the event of arrhythmia, however, deviations of the heart's position will occur for some of the data collection, thereby giving rise to blurring and movement artifacts. Such arrhythmia will further lead to a variation in the repetition time TR, resulting in an increased noise level and degradation of the precision of the $T_1$ measurements, as well as degrading the general image quality of primary images, as noted by C. Galonad, D. J. Drost, S. S. Prato and G. Wisenberg, SMRM, Vol. 2, 1985. It is well known in nuclear medicine that rejection of data collection taken during and immediately after an arrhythmia improves image quality and consistency. In the past, however, it has been difficult to effect such data in a simple and efficacious manner.

The invention is therefore directed to the provision of an improved method and apparatus for rejecting signals that have been taken during cardiac cycles as for example, with a different timing from the regular heartbeat, in order to prevent blurring of the image and to reduce movement artifacts.

Briefly stated, in accordance with the invention, such as R peaks and abnormal peaks in the patient's E.C.G., are monitored and the time interval between such peaks is measured, an irregular time interval is interpreted as an arrhythmia. Prior to the starting of a scan, the average time interval between peaks is determined. As an option to operator, the average time between peaks may be updated during the scan, to account for slow variations in the patient's heart rate. When an interval is measured which falls outside of a range which has been defined by the operator, the data acquisition is suspended until a predetermined number, M, sequential normal heartbeats have passed, wherein M is an integer, for example from 1 to 5 (but not necessarily limited to this range). During the suspension of data acquisition, the magnetic gradient in the field and R.F. pulsing are maintained, thus regenerating steady state conditions. After M sequential normal heartbeats have passed, data that had been acquired for N heartbeats prior to the arrhythmia is repeated, followed by the normal sequence of data collection. N is also a predetermined integer, for example from 1 to 5 (but is not necessarily limited to this range).

As a consequence of employing this technique and the apparatus for effecting the technique, all of the data acquired during an arrhythmia is replaced by data measured during normal heart motion. Blurring and movement artifacts in the MR imaging are therefore reduced.

In order that the invention may be more clearly understood, it will now be disclosed in greater detail with reference to the accompanying drawings, wherein.

Figure 1:
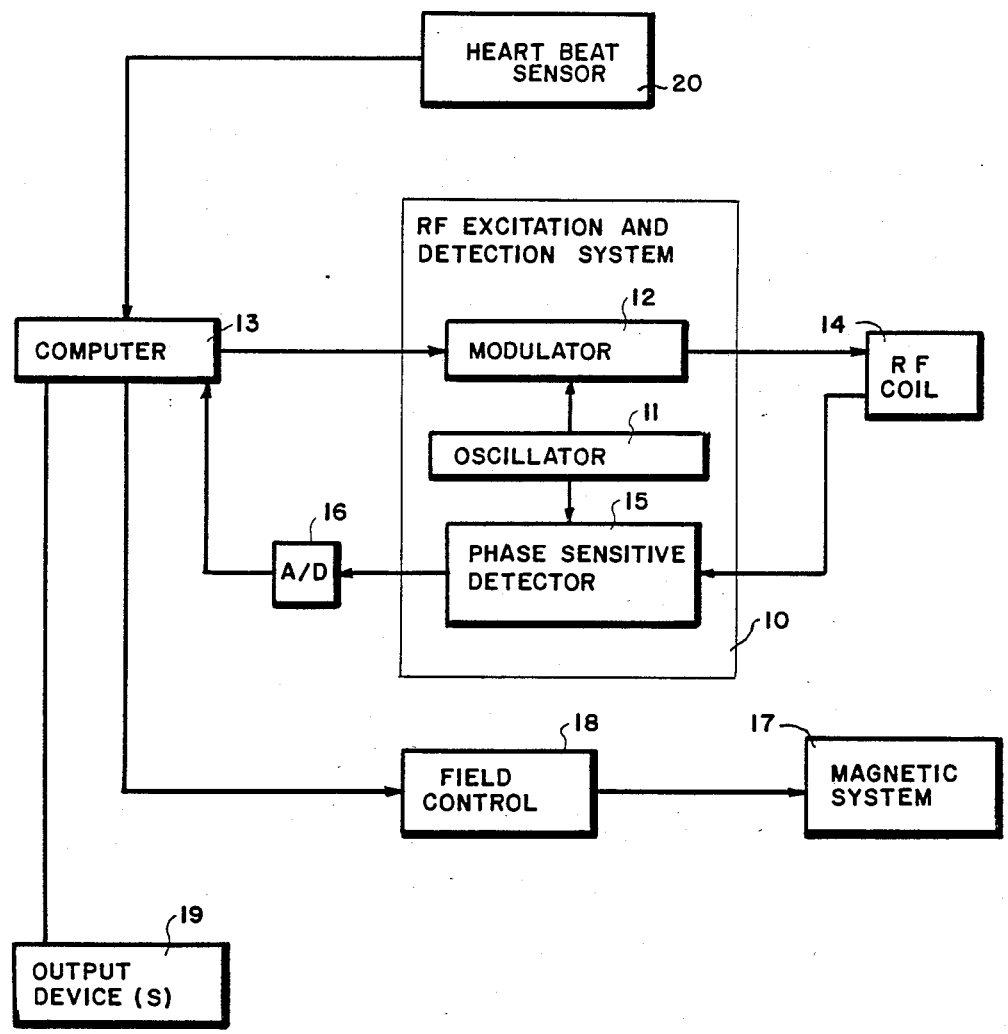
FIG. 1 is a block diagram of MR imaging equipment that may be employed in accordance with the invention.

Referring now to the drawings, and more in particular to FIG. 1, therein is illustrated a block diagram of an MR imaging system, in simplified form, that may be employed in accordance with the invention. As illustrated, an RF excitation and detection system 10 is comprised of an oscillator 11 that may be adjustable in any known manner to provide output oscillations of desired frequency, e.g., the center Larmor frequency of the chemical material to be detected. The oscillations are applied to a modulator 12 responsive to control pulses from a computer 13, for applying pulses of the frequency of the oscillator to an RF coil 14. The coil 14 is adapted to be positioned in the vicinity of the sample, in accordance with known practice. Currents induced in the coil 14 by the sample are applied to a phase sensitive detector 15, in the RF excitation and detection system 10, to which the oscillations from oscillator 11 are also applied. The phase detected output of the detector 15 is applied to an analog-to-digital converter 16. The digital output of the converter 16, corresponding to the intensity of RF signals induced in the coil 14 at a given instant is applied as a data input to the computer 13.

In accordance with conventional practice, the computer 13 may also be employed to control the magnetic system 17, for example for maintaining the main field, gradient field, and any compensating fields, by conventional techniques, by a control circuit 18. The present invention is not specifically concerned with the magnetic arrangement of the imaging system, nor with the specific form of the MR spectrometer arrangement defined at least in part by the RF excitation and detection system 10. In accordance with conventional practice, the computer 13 controls the application of RF pulses and magnetic pulses to the sample by way of the modulator 12 and coil 14 and the application of gradient pulses by way of field control 18, analyzes the signals returned from the coil, and by the use of suitable conventional algorithms, provides output signals to one or more output devices 19 preferably visually representing the distribution of determined chemical constituents of the sample. The output devices may comprise, for example, CRTs or hard copy devices. The specific form of the display or other pictorial representation of the analysis not being of importance to the concept of the present invention.

Still referring to FIG. 1, a conventional heartbeat sensor 20 is also provided for indicating to the computer 13 determined times in the cardiac cycle, for example, R peaks and abnormal peaks. The sensor 20 may comprise a pressure sensor or an ECG monitor affixed in conventional manner to the patient under test. The computer may include a program to effect the excitation of the modulator 12 at determined times with respect to the detected peaks of the cardiac cycle of the patient, as well as to enable the determination of the time that occurs between peaks. The computer maintains a continuing average of the cardiac period over a determined interval, as well as detecting deviations of instantaneous timing from the average that exceed a given range. The computer detects irregularities in the cardiac cycle in order to enable the rejection of data during irregular cardiac cycles (i.e., to suspend data acquisition during such times). It is important, however that, even though irregular cardiac cycles are detected, the pulsing of the modulator 12 and the control of the magnetic system 17 be maintained, in order to maintain steady state conditions in the patient and to ensure maintenance of $T_1$ contrast during the scan.

If desired, the output of the heartbeat sensor 20 may alternatively be employed to control the triggering of the modulator 12 at determined times, as shown, for example, in aforesaid U.S. Pat. No. 4,413,233, i.e., at one or more determined times in each cardiac cycle. It is preferable, however, that the determination of irregular cardiac cycles and the maintenance of the average time be more directly controlled by the computer 13.

Figure 2:
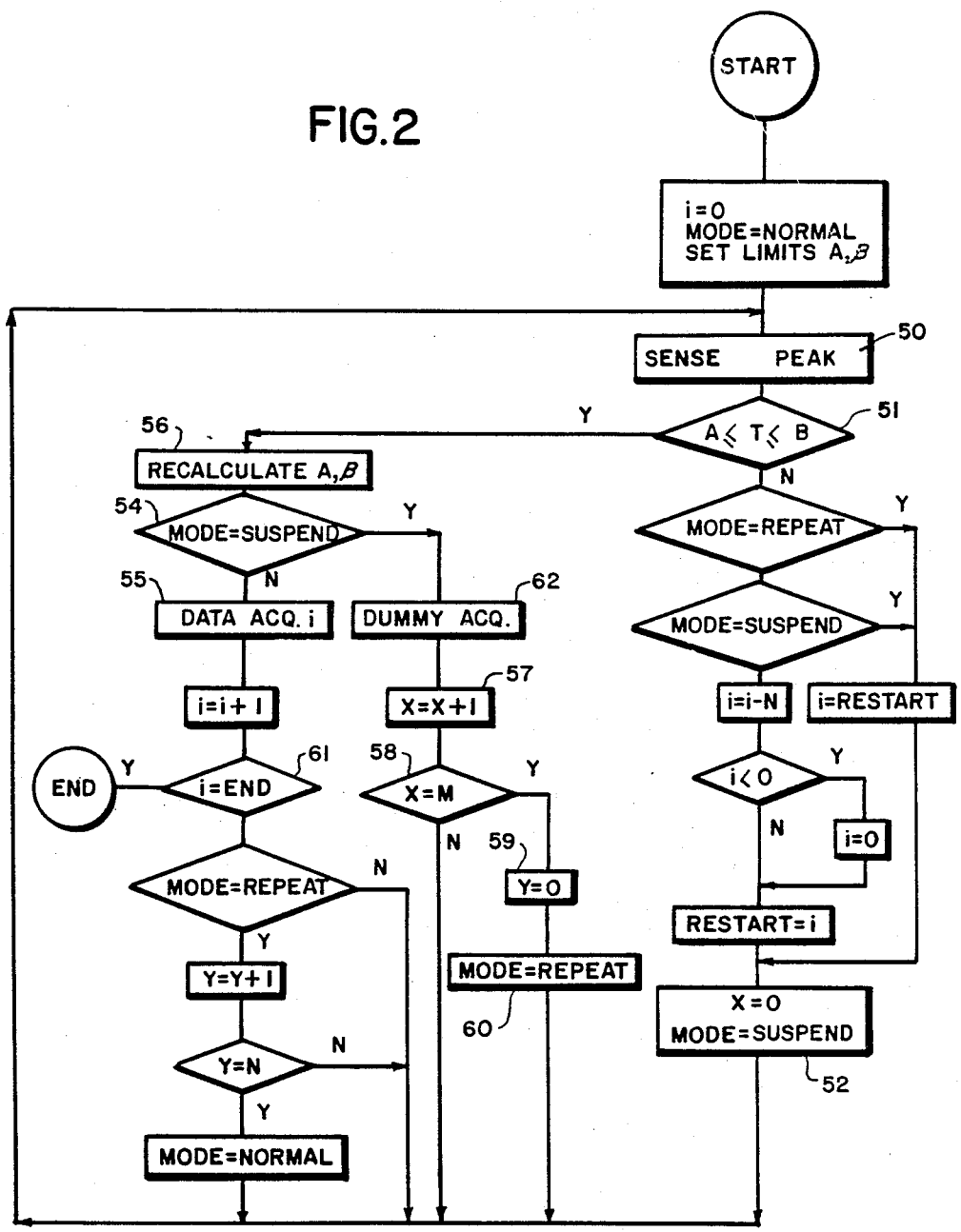
FIG. 2 is a flow diagram illustrating a data rejection method in accordance with the invention.

Referring now to FIG. 2 the following variables are employed in the illustrated method of the invention:

i: counter for the number of data acquisitions done mode: parameter to specify the mode for data acquisitions A,B: lower (A) and upper (B) limit for the interval between peaks to be accepted t: interval time between peaks normal, suspend, repeat: different modes for the data acquisitions x: counter for the number of regular beats after an arrhythmia for which the data acquisiton is suspended y: counter for the number of data collections to be repeated restart: indicator where the data collection to be done after an arrhythmia. If an arrhythmia occurs during the suspend or repeat mode, this parameter will give the point at which data acquisitions are to be restarted. (prevents stepping back to a point prior to a previous arrhythmia)

M: number of "dummy acquisitions" to be performed (number of regular beats to pass after an arrhythmia before continuing data collections, but still applying rf/gradient pulses to get back to a steady state)

N: number of previous data acquisitions repeated after an arrhythmia

END: total number of data aquisitions to be done

As illustrated in FIG. 2, after initialization the peaks of the cardiac cycle, or other cyclic physical characteristic, are sensed at block 50 by any conventional physical characteristic sensing device. The time t between the sensed peak and the immediately preceding peak is compared with a given minimum value A and a given maximum value B to determine if the timing is between the values A and B (and hence normal) or if it is irregular. The range values A and B define the normal range of the cardiac cycle, and may be varied as a function of the average period, as will be discussed. Upon the detection of an irregular timing at block 51, data acquisition is suspended at block 52. The suspension of data acquisition refers to the rejection of any data output from the RF coil in the determination of chemical characteristics of the sample, and hence does not necessarily refer to the cessation of application of data itself to the computer. In addition, in response to the detection of an irregular pulse, i.e., a pulse of irregular timing, a counter is set to zero at block 52 (x=0) in order to provide a reference for the counting of later beats. The program then returns to block 50 to sense the next peak.

If at block 51 it had been determined that the timing was not irregular, a further test is made at block 54 to determine if data acquisition is currently suspended as a result of a previous suspension at block 52. If data acquisition had not been suspended, the program proceeds to acquire the data, i.e., to employ received data in the calculation of chemical constituents, at block 55. Recalculation of the average timing t may be effected at block 56 prior to block 54. The averaging at block 56 may be effected over a determined number of previous cycles of regular timing.

If, on the other hand, it had been detected at block 54 that regular timing has occurred but data acquisition has been suspended, the counter X is stepped at block 57, and its value is compared with an integer value M at block 58. The value M constitutes the number of cardiac cycles of regular timing that must sequentially occur before data acquisition is to continue. If the value M has not been attained, the program returns the process to block 50 to sense the next peak in the cardiac cycle.

If the counter has reached the value M at block 58, this means that the desired number M of regular peaks has been detected so that data acquisition can continue. Accordingly, at block 59 the counter Y is reset, and the data repeat mode is started at block 60. In addition, the results of N data acquisitions immediately preceding the just occurring suspension of acquisition of data are repeated, i.e., data of the repeated N cycles immediately preceding the first detection of an irregular cycle (during the current sequence) are taken into consideration in the determination of the chemical constituents of the sample. (the quantities M an N are preferably integers from 1 to 5). The repetition of data for use in determination of chemical constituents has been found to minimize blurring and movement artifacts in the MR imaging.

The data acquired at block 55 is employed as data in the conventional manner for the formation of one or more images by the output device 19.

In the further details of the program as indicated in FIG. 2, upon the completion of the i th data acquisition in the block 55, the i counter of the number of data acquisitions is stepped, and then tested at block 61 to determine if the desired number of acquisitions has been taken. If so, the program exits at this point. The program otherwise tests the mode and if it is repeat proceeds to a subroutine to step the y counter to loop back for more data acquisition until the count N is reached, following which the mode of operation is returned to normal. It is noted that the block 62, for effecting a dummy acquisition, prior to block 57, does not constitute an actual data acquisition.

In addition, a subroutine is provided between the test of block 51 and the resetting of counter X at block 52, in order for example to enable the proper setting or resetting of the counters in the event that a new arrhythmia has been detected during a repeat or suspend mode, thereby to ensure the proper operation of the program in ensuring the correct number of actual data acquisitions. Thus, in the first sequence following detection of an arrhythmia after normal operation, the quantity N is subtracted from the values i, with i being adjusted to zero in the event of a negative result, and the restart count is set to the value i. In subsequent cycles upon the continued detection of an arrhythmia, the count i is continually reset to the restart value in a continued state of suspend mode operation, as well as in the repeat mode operation following the cessation of a previous period of arrhythmia.

Known techniques other than determination of timing may be employed for the detection of arrhythmia such as, for example only, wave shape detection.

What is claimed:

1. Apparatus for in vivo measurement of magnetic resonance characteristics of biological tissue which is subject to a cyclic physical variation comprising:
    means for sensing the cyclic variation and for producing control signals representative thereof;
    means responsive to the control signals which synchronize the application of magnetic resonance-exciting fields to the tissue with the cyclic variation;
    means for acquiring magnetic resonances data from the tissue in response to the resonance-exciting fields and for employing the data so acquired to calculate the magnetic resonance characteristic;
    means which respond to an irregularity in the period of the cyclic variation which cause the means for acquiring data to cease data acquisition during, and for a period of M cycles after the end of the irregularity while, at the same time, allowing the continued application of the resonance-exciting fields; and
    means which determine the end of the irregularity and the M following cycles and which cause the means for acquiring data to then reacquire any data which was actually acquired during a predetermined number, N, cycles prior to the start of said irregularity and to utilize said reacquired data in the calculation of said magnetic resonance characteristic.

2. The apparatus of claim 1 wherein said cyclic variation is the cardiac cycle and wherein said means for sensing sense ECG peaks.

3. The apparatus of claim 1 wherein the cyclic variation is the cardiac cycle and the means for sensing sense pressure.

4. The apparatus of claim 1 wherein M is an integer in the range of 1 to 5 and N is an integer in the range of 1 to 5.

5. The apparatus of claim 1 further comprising means which repeatedly calculate an average period of the cyclic variation and means which determine the presence of the irregularity whenever the period of the variation deviates from the calculated average by more than a predetermined amount.

6. The apparatus of claim 1 wherein at least one of the exciting fields which continues during said irregularity is a magnetic field.

7. The apparatus of claim 1 wherein said magnetic resonance characteristic is the longitudinal magnetic resonance resonance relaxation time, $T_1$.

8. A method for reducing blurring and artifacts in magnetic resonance images of living tissue which are caused by movement or other variations produced by the cardiac cycle, comprising the steps of:
    applying magnetic resonance-exciting fields to the tissue in synchronization with said cardiac cycle and acquiring magnetic resonance data produced thereby from the tissue;
    detecting the presence of an irregularity in the period of the cardiac cycle and suspending the acquisition of the data in response thereto;
    determining the end of the irregularity, waiting for a first predetermined number, M, of normal cardiac cycle periods after the end of the irregularity and then resuming the acquisition of the data; and
    then reacquiring any data which had previously been acquired during a second predetermined number, N, of cardiac cycles which immediately preceded the start of the irregularity; and
    continuing to apply the magnetic resonance-exciting signals throughout the irregularity and the M normal cycles which follow the irregularity;
    whereby magnetic resonance data which may be perturbed by cardiac arrhythmia is rejected while the steady state magnetic resonance relaxation characteristics of the tissue are maintained during the arrhythmia.

9. A method for in vivo measurement of a magnetic resonance characteristic of biologic tissue which is subject to a cyclic physical variation, comprising the steps of:

sensing the cyclic variation and producing control signals representative thereof;

employing the control signals to synchronize the application of periodic magnetic resonance-exciting fields to the tissue with the cyclic variation;

acquiring magnetic resonance data from the tissue in response to the resonance-exciting fields and using the data so acquired for determining the characteristic, wherein as an improvement, the method further includes the steps of detecting the presence of an irregularity in the period of the cyclic variation;

suspending acquisition of the resonance data upon detection of the irregularity while continuing to apply the resonance-exciting fields to the tissue;

resuming acquisition of the resonance data after said irregularity has been absent for at least a predetermined number, M, of cycles of the cyclic variation; and then repeating acquisition of any magnetic resonance data which had been acquired during a second predetermined number, N, of cycles of the cyclic variation which immediately preceded the detection of the irregularity and utilizing the reacquired data in the determination of the characteristic.

10. The method of claim 9 wherein M is an integer in the range of 1 to 5 and N is an integer in the range of 1 to 5.

11. The method of claim 9 further comprising the step of continually calculating an average period of the cyclic variation and detecting the presence of the irregularity whenever the period of the cyclic variations deviates by more than a predetermined amount from the calculated average.

12. The method of claim 9 wherein the cyclic variation is the cardiac cycle and said step of sensing comprises sensing ECG peaks.

13. The method of claim 9 wherein at least one of the periodic magnetic resonance-exciting fields is a magnetic field.

14. The method of claim 9 wherein the characteristic of the tissue is the local longitudinal magnetic resonance relaxation time, $T_1$.

* * * * *